(12) United States Patent
Marcinkowski et al.

(10) Patent No.: US 11,346,466 B2
(45) Date of Patent: May 31, 2022

(54) CABLE MANAGEMENT SYSTEMS

(71) Applicant: Schroff GmbH, Straubenhardt (DE)

(72) Inventors: Christophe Marcinkowski, Betschdorf (FR); Daniel Thomas, Seebach (FR)

(73) Assignee: Schrott GmbH, Straubenhardt (DE)

( * ) Notice: Subject to any disclaimer, the term of this patent is extended or adjusted under 35 U.S.C. 154(b) by 0 days.

(21) Appl. No.: 17/064,153

(22) Filed: Oct. 6, 2020

(65) Prior Publication Data
US 2021/0102643 A1    Apr. 8, 2021

Related U.S. Application Data

(60) Provisional application No. 62/911,776, filed on Oct. 7, 2019.

(51) Int. Cl.
*F16L 3/015*    (2006.01)
*H05K 7/14*    (2006.01)
*H05K 7/18*    (2006.01)

(52) U.S. Cl.
CPC ............ *F16L 3/015* (2013.01); *H05K 7/1491* (2013.01); *H05K 7/183* (2013.01)

(58) Field of Classification Search
CPC ....... F16L 3/015; H05K 7/1491; H05K 7/183; H05K 5/0247; H05K 7/186; A47B 47/00; H04Q 1/064
See application file for complete search history.

(56) References Cited

U.S. PATENT DOCUMENTS

| | | | |
|---|---|---|---|
| 6,489,565 B1 * | 12/2002 | Krietzman | H02G 3/045 |
| | | | 174/101 |
| 6,605,782 B1 | 8/2003 | Krietzman et al. | |
| 6,785,459 B2 | 8/2004 | Schmidt et al. | |
| 6,946,605 B2 | 9/2005 | Levesque et al. | |
| 6,968,647 B2 | 11/2005 | Levesque et al. | |
| 7,000,784 B2 | 2/2006 | Canty et al. | |
| 7,019,213 B1 | 3/2006 | McNutt et al. | |
| 7,026,553 B2 | 4/2006 | Levesque et al. | |

(Continued)

FOREIGN PATENT DOCUMENTS

| | | |
|---|---|---|
| EP | 3264546 A1 | 1/2018 |
| KR | 100943288 B1 | 2/2010 |

(Continued)

OTHER PUBLICATIONS

Cable Cafe Limited; cable management home page screen shot; 1 page.

(Continued)

*Primary Examiner* — Terrell L McKinnon
*Assistant Examiner* — Ding Y Tan
(74) *Attorney, Agent, or Firm* — Quarles & Brady LLP

(57) ABSTRACT

A cable support member for routing cables within a server cabinet, or other type of electrical enclosure, can have a base with a set of engagement members configured to removably engage with a corresponding set of apertures in a rack angle member of the server cabinet. A plurality of finger members can extend from the base to aid in routing the cables. A cable management system can include multiple sets of cable support members that define a channel through which cables can be routed, and a cover that can be hingedly mounted to the cable support members.

16 Claims, 17 Drawing Sheets

(56) References Cited

U.S. PATENT DOCUMENTS

| | | |
|---|---|---|
| 7,119,282 B2 | 10/2006 | Krietzman et al. |
| 7,152,936 B2 | 12/2006 | Tarasewicz |
| 7,178,679 B2 | 2/2007 | Canty et al. |
| 7,225,586 B2 | 6/2007 | Levesque et al. |
| 7,362,941 B2 | 4/2008 | Rinderer et al. |
| 7,378,046 B2 | 5/2008 | Canty et al. |
| RE41,353 E | 5/2010 | McGrath et al. |
| 7,893,356 B2 | 2/2011 | Garza et al. |
| 7,939,763 B2 | 5/2011 | Jones et al. |
| 7,963,486 B2 | 6/2011 | Wilson et al. |
| 7,973,242 B2 | 7/2011 | Jones et al. |
| 7,999,183 B2 | 8/2011 | Garza et al. |
| 8,138,419 B2 | 3/2012 | Garza et al. |
| 8,237,052 B2 | 8/2012 | Adducci et al. |
| 8,263,867 B2 * | 9/2012 | Garza .................. H02G 3/0456 174/101 |
| 8,273,989 B2 | 9/2012 | Garza et al. |
| 8,330,043 B2 | 12/2012 | Alaniz et al. |
| 8,403,154 B2 | 3/2013 | Smith et al. |
| 8,576,580 B2 | 11/2013 | Kelly et al. |
| 8,710,369 B2 | 4/2014 | Krietzman et al. |
| 8,746,466 B2 | 6/2014 | Taylor |
| 8,901,438 B2 | 12/2014 | Lewis, II et al. |
| 9,270,097 B2 | 2/2016 | Krietzman et al. |
| 9,408,326 B2 | 8/2016 | Lewis, II et al. |
| 9,642,270 B2 | 5/2017 | Lewis, II et al. |
| 9,814,150 B2 | 11/2017 | Krietzman et al. |
| 9,814,159 B2 | 11/2017 | Lewis, II et al. |
| 9,980,400 B2 | 5/2018 | Lewis, II et al. |
| 10,141,728 B1 | 11/2018 | Valenti et al. |
| 10,178,784 B2 | 1/2019 | Lewis, II et al. |
| 10,237,994 B2 | 3/2019 | Donowho et al. |
| 10,271,452 B2 | 4/2019 | Hennrich et al. |
| 10,342,155 B2 | 7/2019 | Wang et al. |
| 10,477,720 B2 | 11/2019 | Hennrich et al. |
| 10,588,227 B2 | 3/2020 | Donowho et al. |
| 2004/0007372 A1* | 1/2004 | Krietzman ............. H04Q 1/062 174/50 |
| 2005/0173596 A1 | 8/2005 | Herzog |
| 2010/0193754 A1* | 8/2010 | Garza .................. H02G 3/0456 254/134.3 CL |
| 2010/0200707 A1* | 8/2010 | Garza .................. H02G 3/0456 248/65 |
| 2011/0068233 A1* | 3/2011 | McGrath ............. H02G 3/0406 248/65 |
| 2012/0062091 A1 | 3/2012 | Donowho et al. |
| 2012/0273627 A1 | 11/2012 | Fritz et al. |
| 2019/0075375 A1 | 3/2019 | Fariello et al. |
| 2019/0098790 A1 | 3/2019 | Mordick |
| 2019/0098792 A1 | 3/2019 | Hennrich et al. |
| 2019/0215973 A1 | 7/2019 | Donowho et al. |
| 2019/0296530 A1* | 9/2019 | Krietzman ............... H04Q 1/14 |
| 2021/0044876 A1* | 2/2021 | O'Young ............... H04Q 1/064 |

FOREIGN PATENT DOCUMENTS

| | | |
|---|---|---|
| KR | 101444714 B1 | 8/2014 |
| WO | 0218992 A1 | 3/2002 |

OTHER PUBLICATIONS

Panduit R4PFR Panduit Cable Management Fingers—Cable Manager; advertisement from <https://lemonwire.com/2018/10/01/panduit-r4pfr-panduit-cable-management-fingers-cable-manager-black-1-pack-for-federal-government-october-1-december-31-2018/>.

* cited by examiner

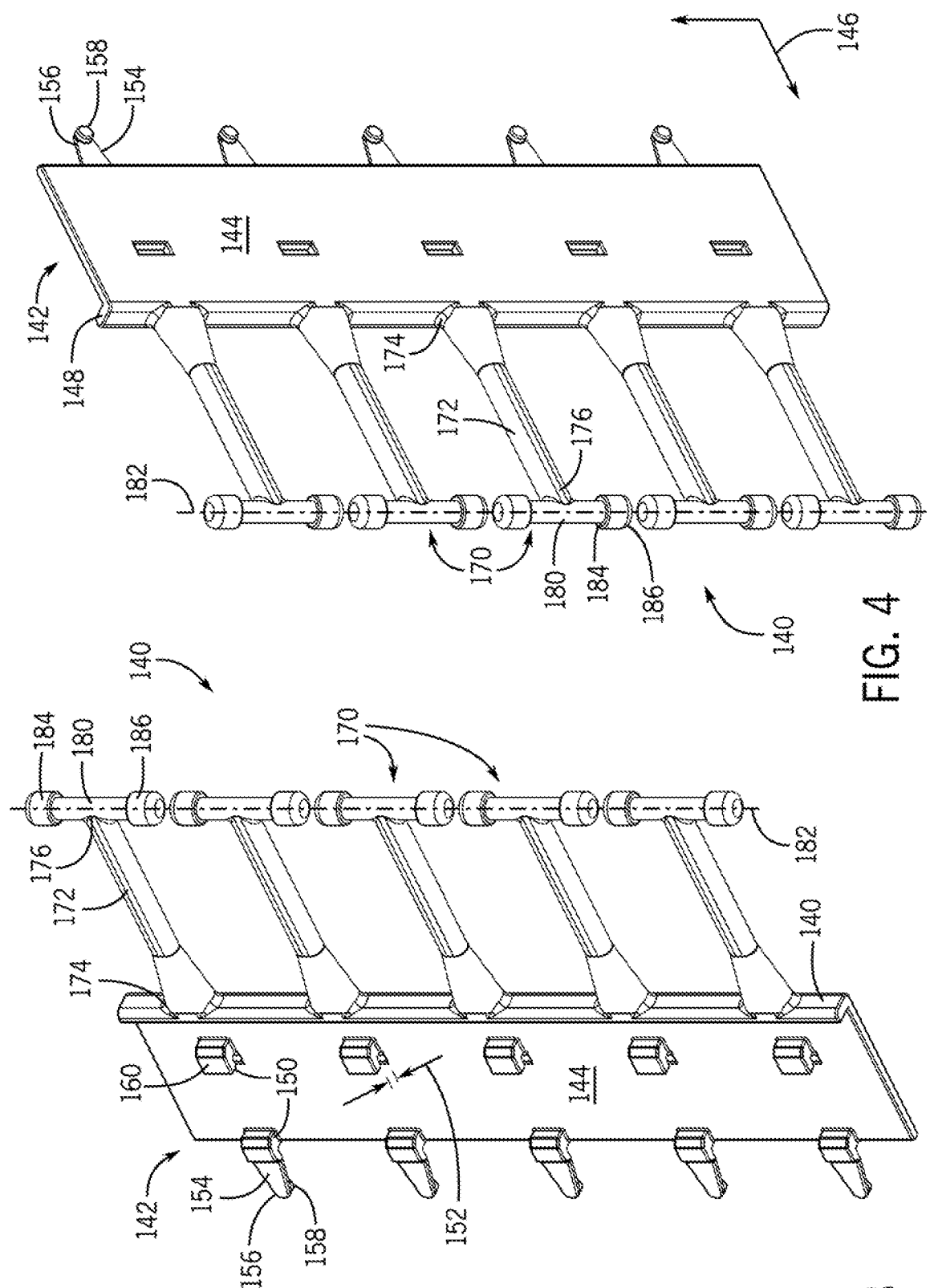

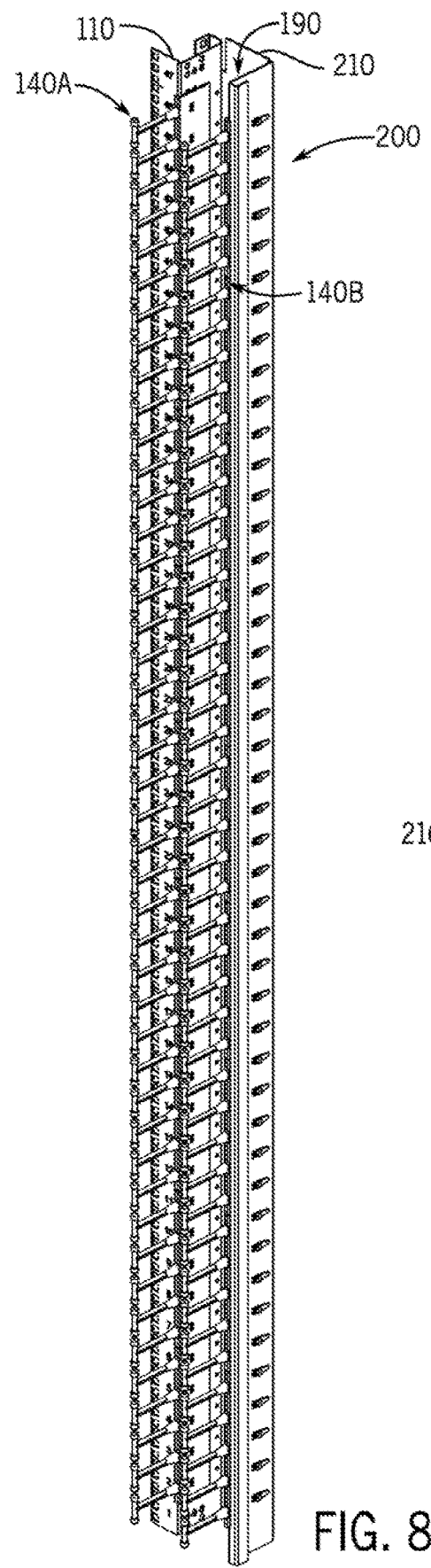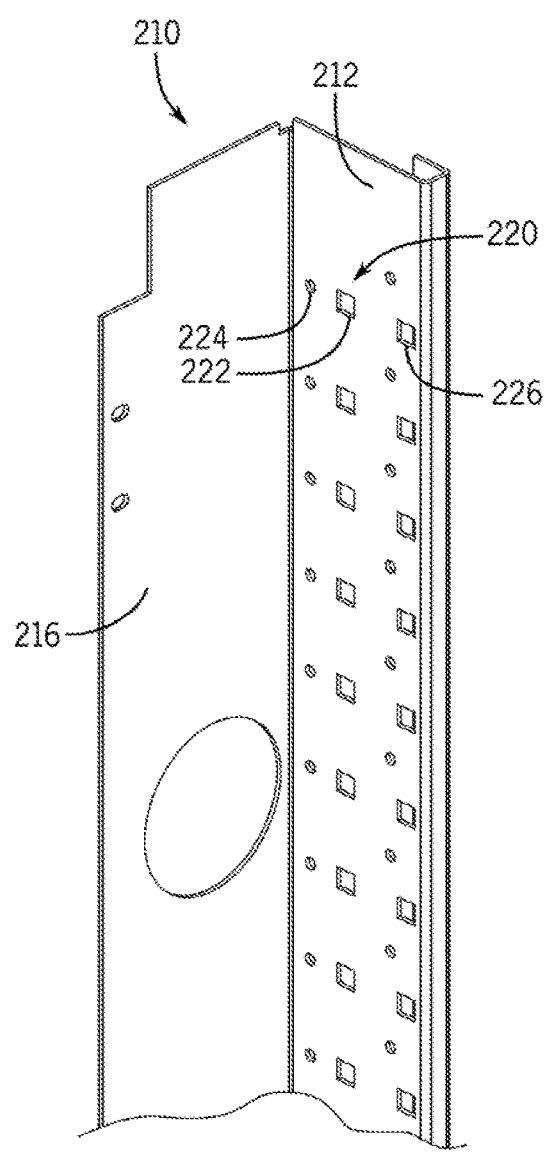
FIG. 8
FIG. 9

CABLE MANAGEMENT SYSTEMS

RELATED APPLICATIONS

This application claims priority under 35 U.S.C 119 from U.S. Provisional Application No. 62/911,776, filed Oct. 7, 2019, which is incorporated herein by reference in its entirety.

BACKGROUND

In many applications it may be useful to support cables in a cabinet, such as electrical cables in server racks and cabinets. For example, it may be useful to provide a designated place to run the cables to better organize the server cabinet and protect the cables. In some contexts, it may also be useful to run the cables along the front portion of the cabinet to provide easy access to the cables and the ports on the server equipment in the cabinet.

SUMMARY

Some embodiments of the invention provide a cover for a cable management system that can include cable support members with finger members. The cover can include a cover body configured to at least partially enclose cables within the cable management system, and plurality of hinge elements extending along a first side of the cover body. The hinge elements can be alternatingly radially spaced in opposing directions from a hinge axis to form a hinge channel. Each of the plurality of hinge elements can be configured to engage with a cable support member of the cable management system, to support the cover for hinging movement relative to the cable support member, when the cable support member is disposed along the hinge axis.

Other embodiments of the invention provide a cable management system. The cable management system can include a cover including a plurality of hinge elements and a first cable support member having a plurality of finger members. The plurality of hinge elements can extend along a first side of the cover and can be alternatingly radially spaced from a hinge axis to form a hinge channel. Each of the hinge elements can have a set of first and second recesses. Each of the finger members of the first cable support member can have a first hinge pin member with a first set of first and second hinge pin distal ends aligned along a first hinge pin member axis. The sets of first and second hinge pin distal ends can be received within the sets of recesses, with the hinge pin member axis aligned with the hinge axis, to hingedly secure the cover to the first cable support member.

Yet other embodiments of the invention provide a method for covering a cable channel of an equipment cabinet. The cable channel can be defined by first and second cable support members. The method can include selectively aligning a plurality of hinge elements that extend along a first side of a cover with a set of hinge pin members of either the first cable support member or the second cable support member. After aligning the plurality of hinge elements with the set of hinge pin members, the plurality of hinge elements can be engaged with the set of hinge pin members. The cover can then be rotated relative to the hinge pin members to a closed orientation. With the cover in the closed orientation, a set of hinge pin members of the other of the first cable support member or the second cable support member can be retained with a retaining element that extends along a second side of the cover opposite the first side.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 3 is a bottom left front isometric view of a cable support member of FIG. 1;

FIG. 4 is a top right front isometric view of the cable support member of FIG. 3;

FIG. 8 is a top right front isometric view of a vertical cable channel and cable support members according to an embodiment of the invention;

FIG. 9 is an enlarged top left front isometric view of a portion of a channel bracket according to an embodiment of the invention;

DETAILED DESCRIPTION

Figure 1:
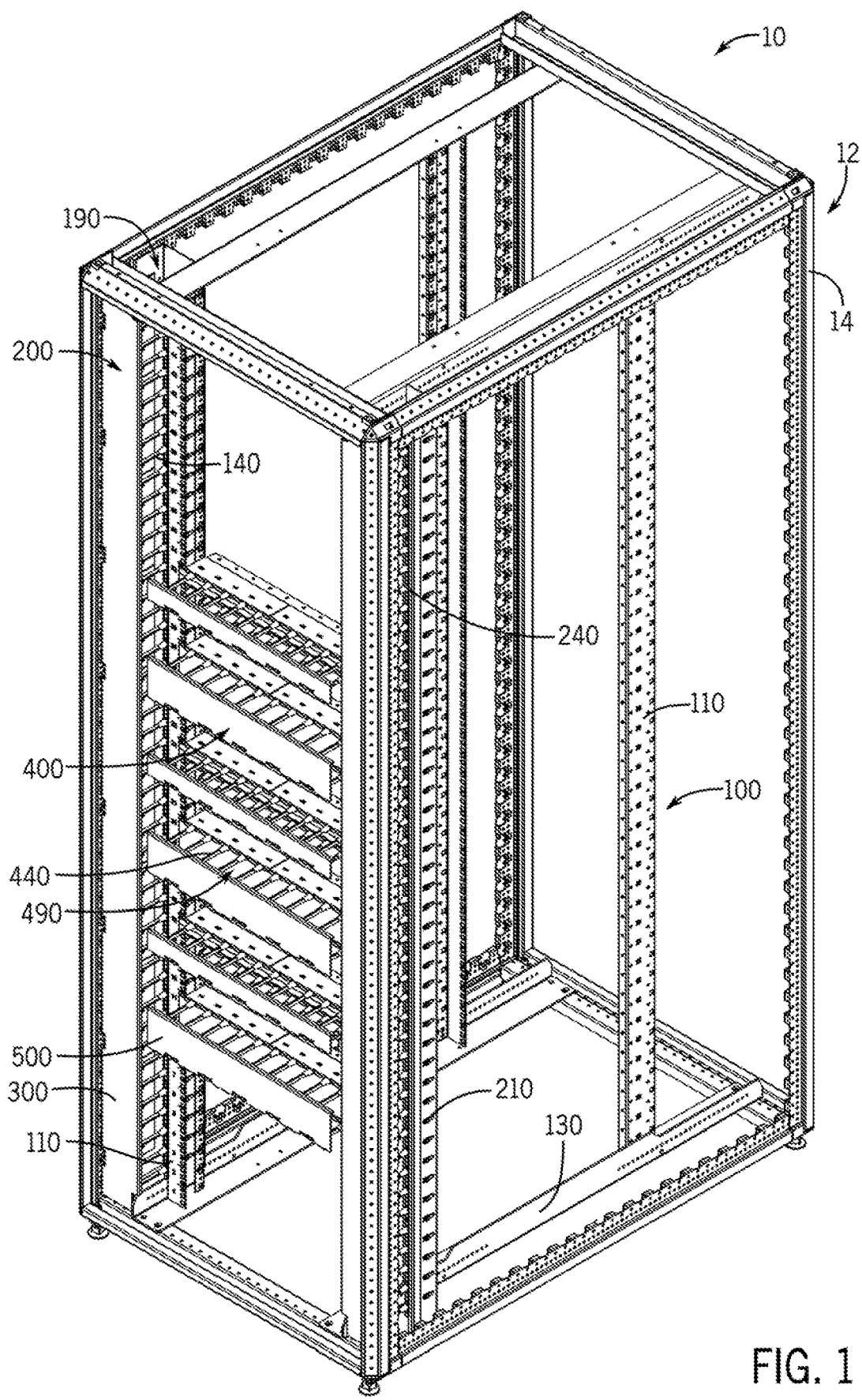
FIG. 1 is a top right front isometric view of a server cabinet with cable support members according to an embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

As used herein, unless otherwise defined or limited, "approximately equal" indicates that a relevant aspect of a corresponding dimension or other corresponding measurement on two components is identical or identical to within acceptable manufacturing tolerances for molded or stamped parts within the industry. In particular, distances or angles described as "approximately equal" are considered as actually equal or differing by no more than 10% of the smaller of the distances or angles.

Similarly, unless otherwise defined of limited, "substantially" indicates that a relevant component exhibits more than 80% compliance with a reference characteristic (e.g., 90% compliance, 95% compliance, or 95% compliance). For example, "substantially identical" components are components that are more than 80% identical, and features that extend substantially over a length or substantially fill a volume extend over more than 80% of the length or fill more than 80% of the volume.

Some of the discussion below describes a cable management system that can be used to improve the ease of routing and organizing cable within a server cabinet. The context and particulars of this discussion are presented as examples only. For example, embodiments of the disclosed invention can be configured in various ways, including with other shapes and arrangements of elements. Similarly, embodiments of the invention can be used with arrangements of server cabinets, supports for server cabinets, or other assemblies, including other types of electrical enclosures, other than those expressly illustrated or described herein.

In conventional arrangements, routing cables in a server cabinet can be achieved through various methods, including bundling the cables together with tie straps and tying the bundle to the frame members of the server cabinet, routing the cables through flexible conduit and mounting the conduit to the frame members, or mounting a cable management bracket between frame members and server rack angles through which cables can be routed. Although these conventional arrangements can provide an adequate cable-routing option, the cable routing can be time-consuming, disorganized, and difficult to alter.

Embodiments of the invention can address these or other issues. For example, in some embodiments, a cable management system can be used to improve the ease of running and organizing cables within a server cabinet, such as by incorporating cable support members that can be removably secured to a structural member within the server cabinet. In some embodiments, cable support members according to the invention can be readily installed by hand, including without the use of fasteners or tools. In some embodiments, cable support members according to the invention can be installed even after cables have been routed through the server cabinet. Further, parallel sets of cable support members can be provided to define a cable channel, both vertically and horizontally, within the server cabinet. Additionally, some embodiments of the invention can include cable support members that include hinge elements that interact with hinge elements on a cover to provide a more protected, but still easily accessible, cable channel.

In some embodiments, a cover can be provided that can be readily installed onto a cable management system. For example, some covers according to the invention can be configured to be manually installed onto (or uninstalled from) fingers of a cable management system without the need for separate fasteners. Further, some covers according to the invention can be configured to be selectively installed in multiple orientations. For example, some covers can include hinge elements that can be snapped (or otherwise secured) onto either of two arrays of cable management fingers that are on opposing sides of a cable channel of a cable management system. Accordingly, the cover can be selectively installed to hinge open in either of two directions, thereby substantially increasing the adaptability of a particular installation. In some cases, covers can further include one or more angled flanges or other retaining element that can be engaged with the array of the cable management fingers that is not engaged by the hinge elements, to secure the cover in a closed orientation.

FIG. 1 illustrates a server cabinet 10 with example cable management systems 200, 400 according to embodiments of the present invention. In other embodiments, other cable management systems can be used with the server cabinet 10, or the cable management systems 200, 400 can be used with other cabinets. In the illustrated example, the server cabinet 10 includes a frame 12 with frame members 14 and a server rack 100 comprising rack angle members 110 and horizontal members 130. The horizontal members 130 extend between and are coupled to the frame members 14 at the top and the bottom of the frame 12 and the rack angle members 110 extend vertically between and are coupled to the horizontal members 130. As shown here, a plurality of cable support members 140, 440 of the cable management systems 200, 400 are removably coupled to the rack angle members 110 to form vertical cable channels 166 and horizontal cable channels 490, and covers 300, 500 can be attached to the plurality of cable support members 140, 440 to enclose the vertical and horizontal cable channels 166, 490 (discussed in greater detail below).

Figure 2:
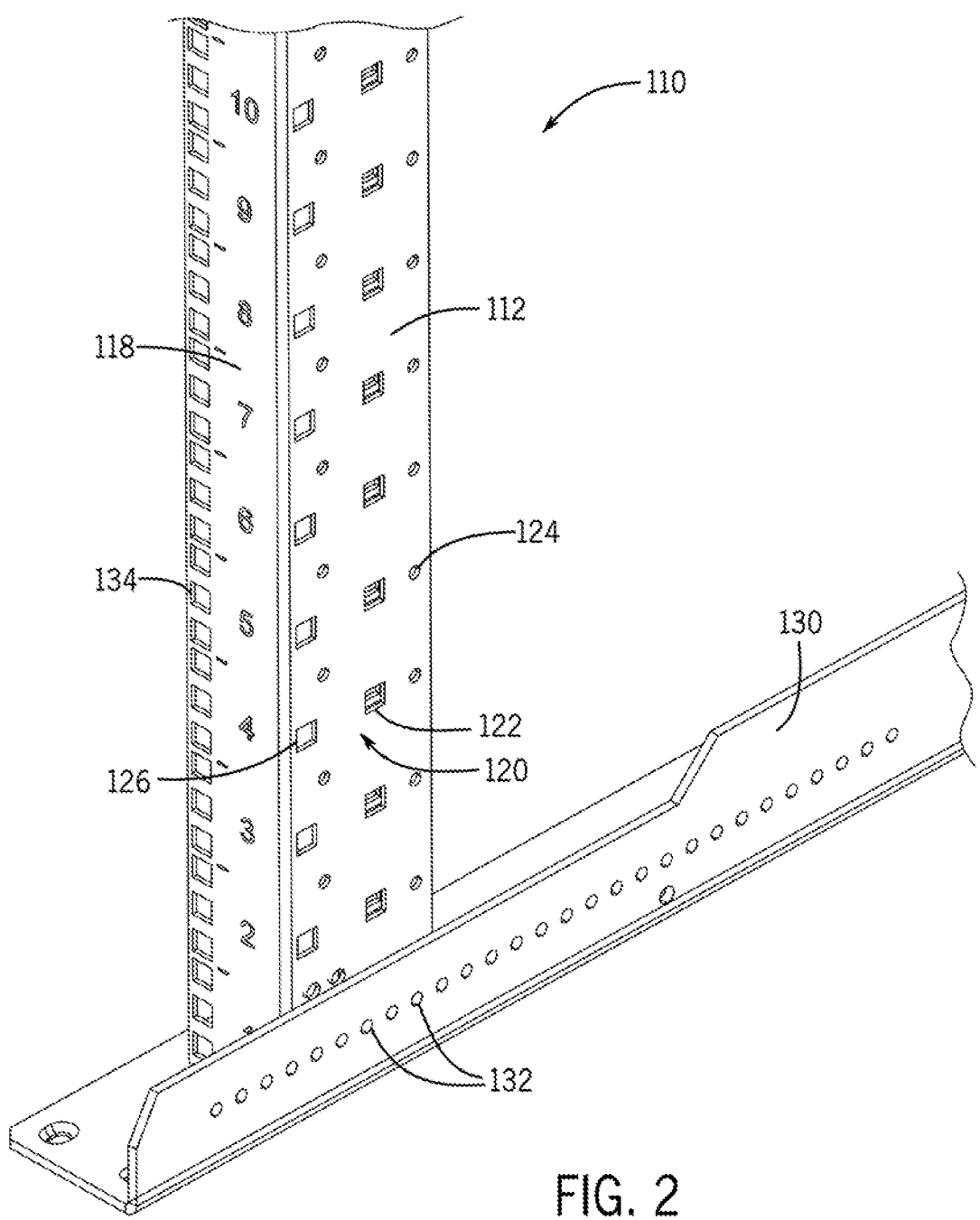
FIG. 2 is an enlarged view of a portion of the server cabinet of FIG. 1 encircled by circle 2-2.

In some embodiments, a support member (e.g., rack angle) of a cabinet can include an array of holes that allows easy and secure installation of cable support members. For example, some support members can include an array of sets of at least two openings, with each set configured so that a cable support member can be inserted through separate holes of the set in different directions to be secured in place. In this regard, for example, FIG. 2 illustrates a portion of one of the rack angle members 110 and the coupling to one of the horizontal members 130. The horizontal member 130 has a plurality of holes 132 in which a fastener may be received therethrough and into a hole in the rack angle member 110 to secure the coupling therebetween. As shown, the rack angle member 110 can be coupled to the horizontal member 130 at multiple locations along the horizontal member 130 depending on the desired size and configuration of the server rack 100 (shown in FIG. 1). The rack angle member 110 has a plurality of apertures in a first planar member 112 with a first planar portion thickness 114 (see FIG. 10), the plurality of apertures including an aligned row of a first aperture 122, a second aperture 124, and a third aperture 126 and other identical aligned rows (not numbered), with the apertures 122, 124, 126 arranged to provide a plurality of sets of aligned apertures, each including one of each of the apertures 122, 124, 126.

In the illustrated embodiment, a set of three apertures is provided, with the leading two of the apertures 126, 122 being rectangular (e.g., square) and the trailing third aperture 124 being round (e.g., circular). In other embodiments, different numbers, shapes, or other configurations (e.g., spacings) for the apertures are possible.

FIGS. 3-6 illustrate a cable support member 140 according to an embodiment of the invention, as can be used with any one of the rack angle members 110 or other similar support members. Generally, cable support members according to embodiments of the invention can be configured to engage rack angles or other support members at multiple apertures thereof and with an interleaved structural engagement via the multiple apertures, to provide a removable but secure attachment. In this regard, for example, the cable support member 140 has a base 142, a set of engagement members 150, and a plurality of finger members 170. As further detailed below, for the illustrated example, aligned sets of the engagement members 150 can engage multiple apertures on one of the rack angle members 110 to secure the cable support member 140 for use. In other embodiments, however, a cable support member may have a different number of sets of engagement members.

The base 142 also has a body 144 that is substantially rectangular in shape and defines a base plane 146 (shown in FIG. 4). The set of engagement members 150 extend outward from the body 144 a first distance 152 (shown in FIG. 3) and also extend parallel to the base plane 146. The first distance 152 is preferably substantially equal to or slightly greater than the first planar portion thickness 114 (shown in FIG. 10).

In different embodiments, different configurations are possible for engagement members of a cable support member. In particular, in the embodiment illustrated in FIGS. 3 and 4, the engagement members 150 include a first engagement member 154 and a second engagement member 160. The first and second engagement members 154, 160 are aligned along an elongate direction 162 (shown in FIG. 5) that also corresponds to an elongate direction of the associated finger members 170, and a distal end 156 of the first engagement member extends past a distal end of the body 144, opposite the finger members 170. The first engagement member 154 includes a protrusion 158 extending from the distal end 156 of the first engagement member 154 toward the base plane 146. The second engagement member 160 includes a hooked profile that extends to a distal end in a similar direction as the first engagement member 154, but does not extend past an edge of the body 144. The base 142 also include a shoulder 148 extending along one side of the body 144. The shoulder 148 extends substantially perpendicular from the body 144 in the same direction as the engagement members 150. In the illustrated embodiment, the shoulder 148 is substantially planar, although other configurations are possible, such as a shoulder with a distal lip or other hooked profile.

Figure 5:
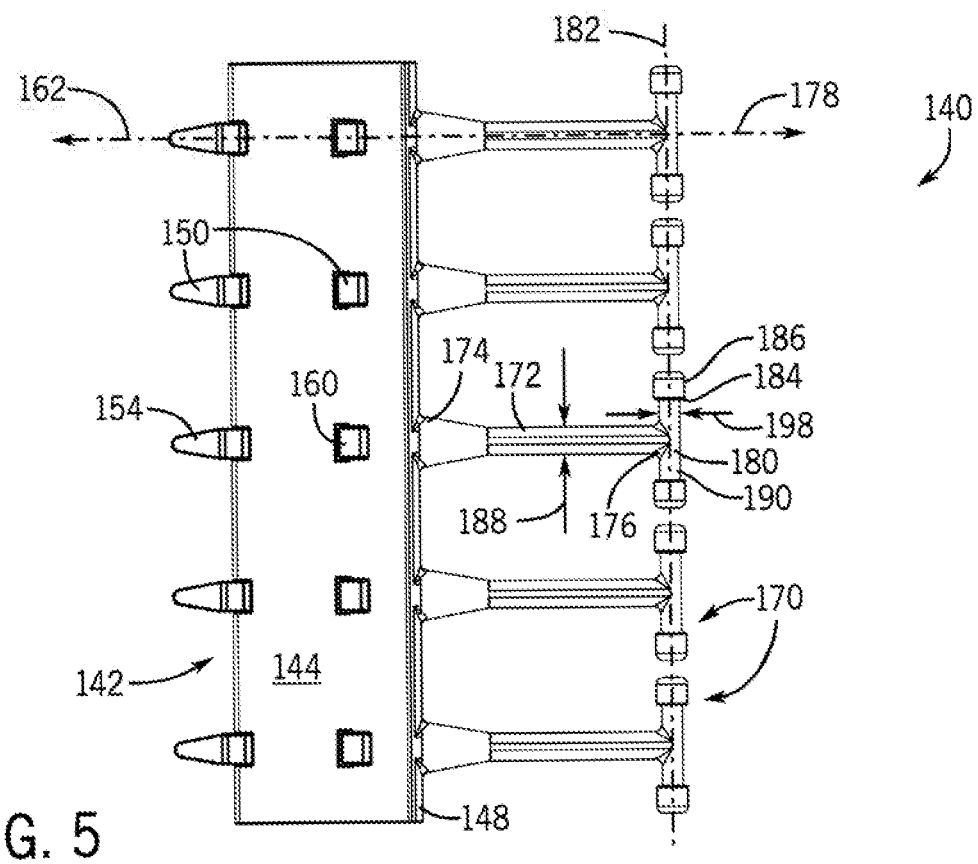
FIG. 5 is a right side elevation view of the cable support member of FIG. 3.
Figure 6:
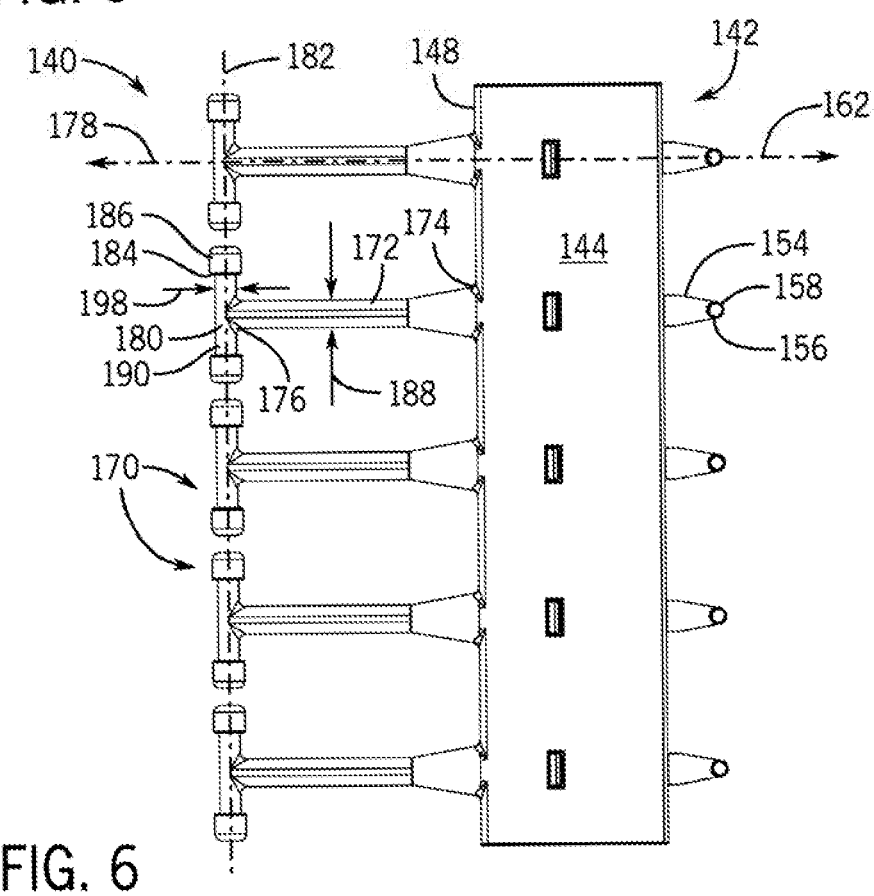
FIG. 6 is left side elevation view of the cable support member of FIG. 3.

In different embodiments, different configurations of fingers to support cables or other structures (e.g., covers) can be used. In the illustrated embodiment, the plurality of finger members 170 extend outwardly from the body 144, as supported by the shoulder 148, substantially along the base plane 146. The plurality of finger members are aligned with the first and second engagement members 154, 160 along the elongate direction 162 and extend along the base plane 146 in an opposite direction relative to the first and second engagement members 154, 160. Each finger 170 includes a shaft 172 and a hinge pin member 180. The shaft 172 has a shaft proximal end 174 adjacent the body 144, a shaft distal end 176 extending away from the shaft proximal end 174 with a shaft thickness 188 (see FIGS. 5 and 6), and a shaft axis (e.g., a shaft axis 178 as shown in FIGS. 5 and 6).

Generally, hinge pin members can include a variety of profiles to help secure cables in place, engage covers, define cable passages, and so on. In some embodiments, a hinge pin member can extend transversely (e.g., perpendicularly) to a shaft axis of a hinge pin shaft. In some embodiments, a hinge pin member can exhibit widened end portions (e.g., widened free ends) relative to other portions of the hinge pin member (e.g., to form a hinge pin member with a dumbbell shape). In this regard, for example, the hinge pin member 180 includes a set of hinge pin distal ends 184 on opposite ends of a hinge pin bar 190 and aligned along a hinge pin member axis 182. The hinge pin distal ends 184 each have a bulbous portion 186 that exhibits a larger characteristic diameter than adjacent (e.g., central) parts of the hinge pin bar 190 (e.g., as measure by a hinge pin bar thickness 198 perpendicular to the hinge pin member axis 182, as shown in FIGS. 5 and 6). The hinge pin member 180 extends from the shaft distal end 176 and, in the illustrated example, the hinge pin member axis 182 is substantially perpendicular to the shaft axis 178 and lies substantially within the base plane 146. In other embodiments, however, other configurations are possible.

Figure 7A:
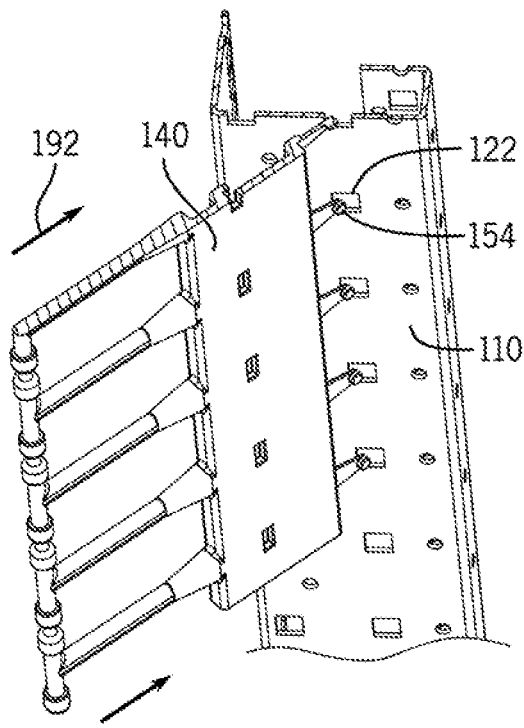
FIGS. 7A-7D illustrate a method for attaching a cable support member to a rack angle member according to an embodiment of the invention.
Figure 7B:
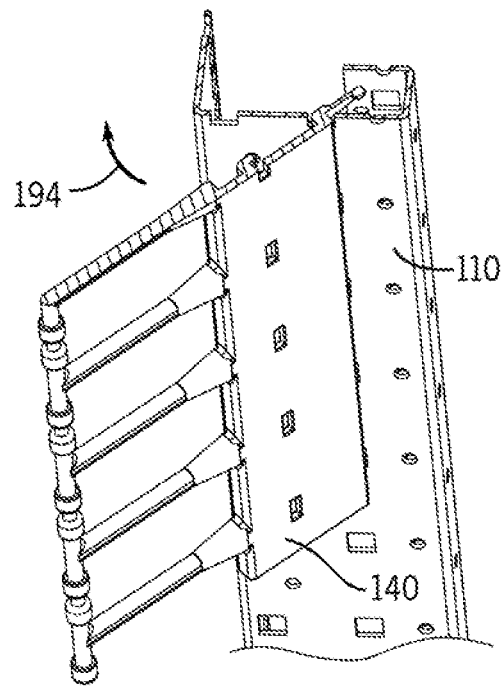

FIGS. 7A-7D illustrate a method of installing the cable support member 140 on the rack angle member 110 of the server cabinet 10 (shown in FIG. 1) according to an embodiment of the invention. The method includes inserting each of the first engagement members 154 of the cable support member 140 in a first direction 192 into a corresponding first aperture 122 in the rack angle member 110, as shown in FIG. 7A. The cable support member 140 is then rotated toward the rack angle member 110 in a second direction 194 as shown in FIG. 7B. In some embodiments, rotation of the cable support member 140 can at least partly proceed simultaneously with insertion in the first direction, although other approaches are also possible.

Figure 7C:
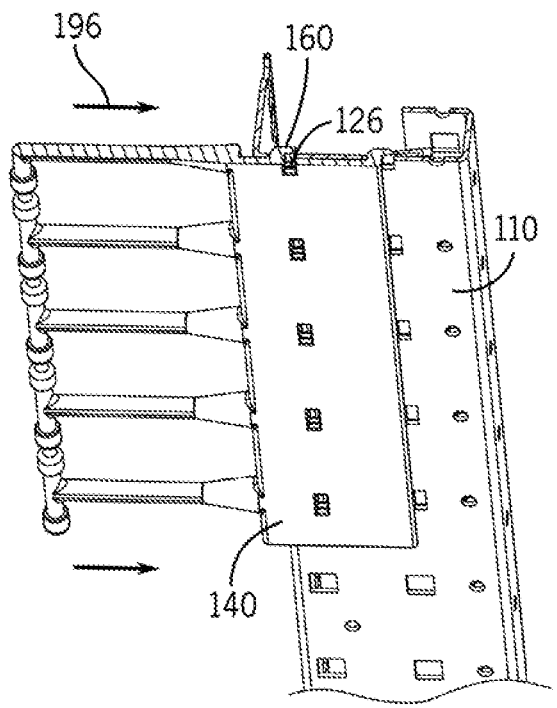
Figure 7D:
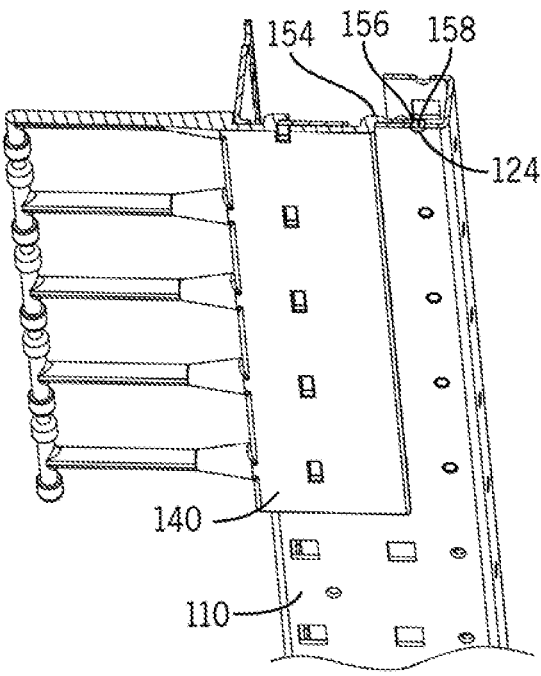

The combination of insertion and rotation in the directions 192, 194 can bring the second engagement members 160 into alignment with respective third apertures 126 on the rack angle member 110. Accordingly, as the cable support member 140 comes into contact with the rack angle member 110, each of the second engagement members 160 is received within a corresponding one of the third apertures 126 on the rack angle member 110. As needed, the cable support member 140 can then be translated relative to the rack angle member 110 in a third direction 196 as shown in FIG. 7C. Thus, the protrusions 158 at the distal ends 156 of each of the first engagement members 154 is received within a corresponding second aperture 126 as shown in FIG. 7D, to retain the engagement of the cable support member 140 with the rack angle member 110, the hooked profiles of the second engagement members 160 engage the rack angle member 110 at the third apertures 126, and the shoulder 148 of the cable support member 140 is brought into contact with the rack angle member 110 to provide further stability.

In some embodiments, other orders of steps may be possible. For example, in some implementations, rotation of the cable support member 140 in the direction 194 can cause the hooked profiles of the second engagement members 140 to engage the rack angle member 110 at the third apertures 126, and can cause the protrusions 158 to engage the second apertures 126, without requiring post-rotational translation of the cable support member 140. As another example, a hooked profile at the shoulder 148 of the cable support member 140 (not shown in the illustrated embodiment) can be configured to engage a corresponding edge of a support member upon (or without) post-rotational translation.

Figure 10:
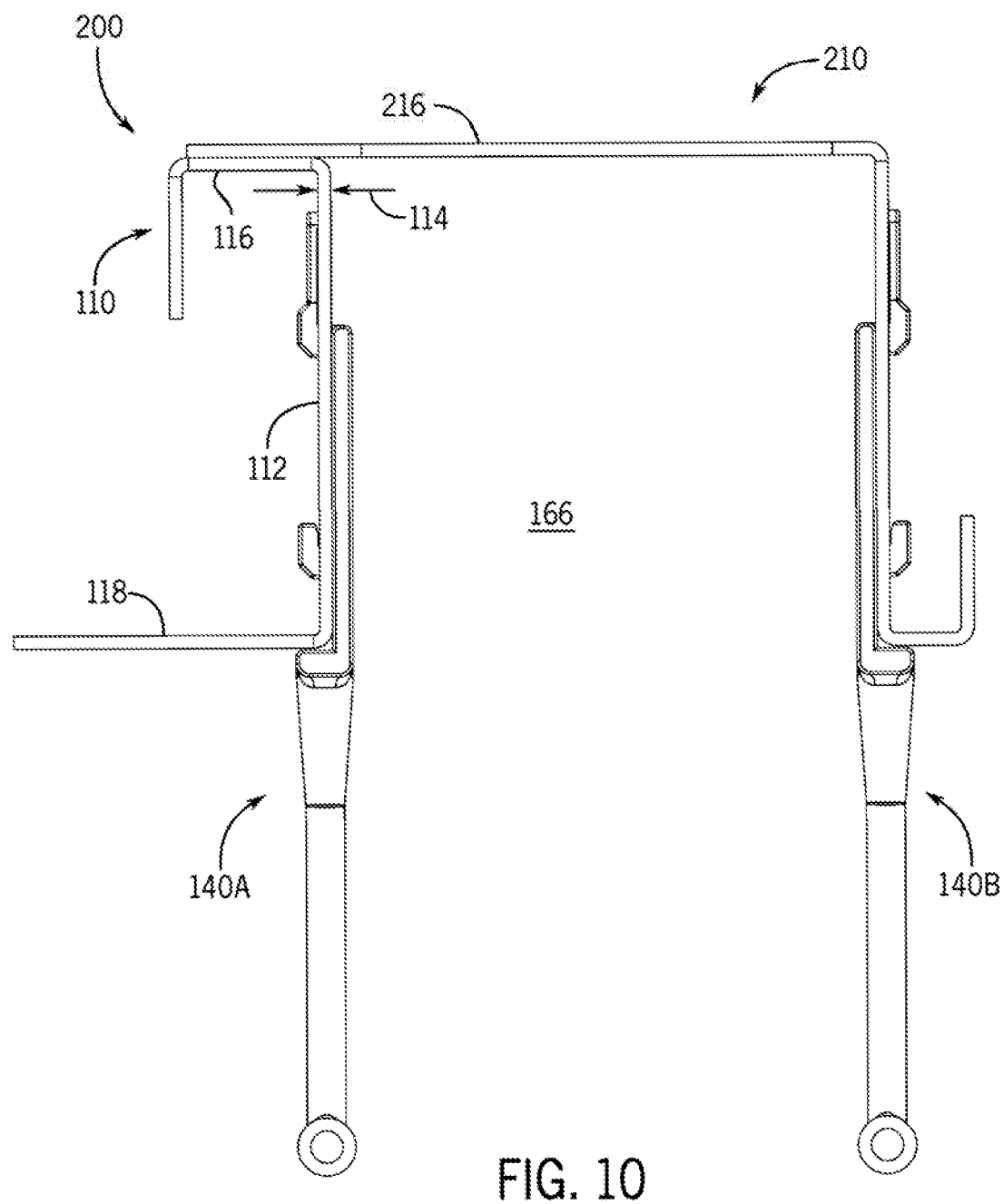
FIG. 10 is a top plan view of the vertical cable channel and cable support members of FIG. 8.

In some embodiments, multiple rack angles (or other support members) and multiple sets of cable support members can be used to define a cable management channel. For example, FIGS. 8-10 illustrate an example configuration of the cable management system 200 (see also FIG. 1) in isolation, according to an embodiment of the invention. The cable management system 200 includes the rack angle member 110 and a plurality of the cable support members 140 and further includes a channel bracket 210. The channel bracket 210 is configured to be coupled to the rack angle member 110 along respective planar portions 116, 216 thereof (see, e.g., FIG. 10). The channel bracket 210 also has apertures 220 (a first aperture 222, a second aperture 224, and a third aperture 226 shown in FIG. 9) in a first planar portion 212 that are substantially identical to the first, second, and third apertures 122, 124, 126 in the first planar portion 112 of the rack angle member 110. Accordingly, a vertical cable channel 166 can be defined between a first set cable support members 140A coupled to the rack angle member 110 and a second set of cable support members 140B similarly coupled to the channel bracket 210.

Figure 11:
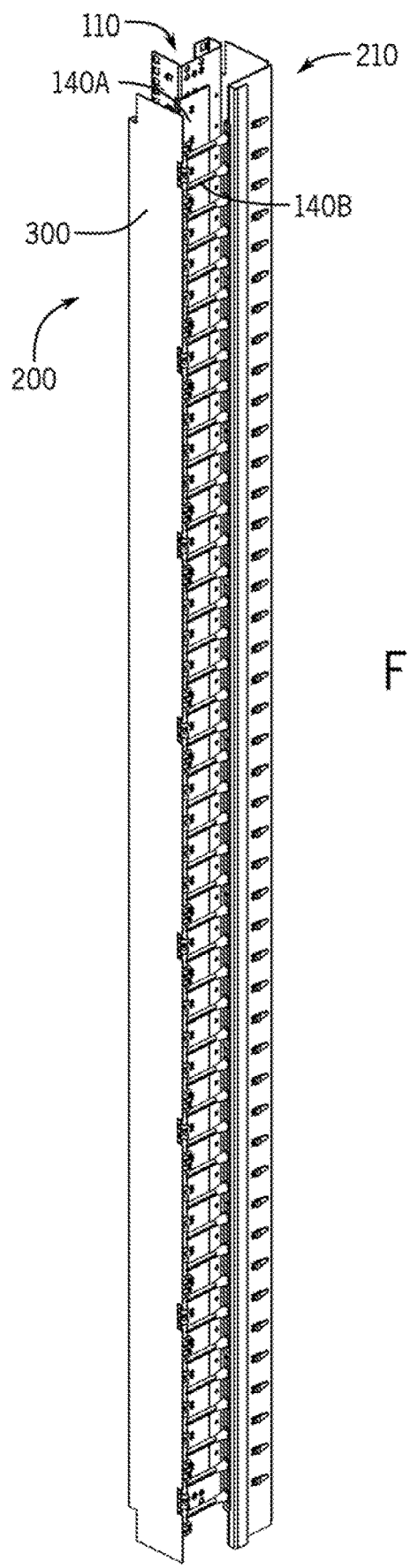
FIG. 11 is a top right front isometric view of the vertical cable channel and cable support members of FIG. 8 with a cover according to an embodiment of the invention.
Figure 12:
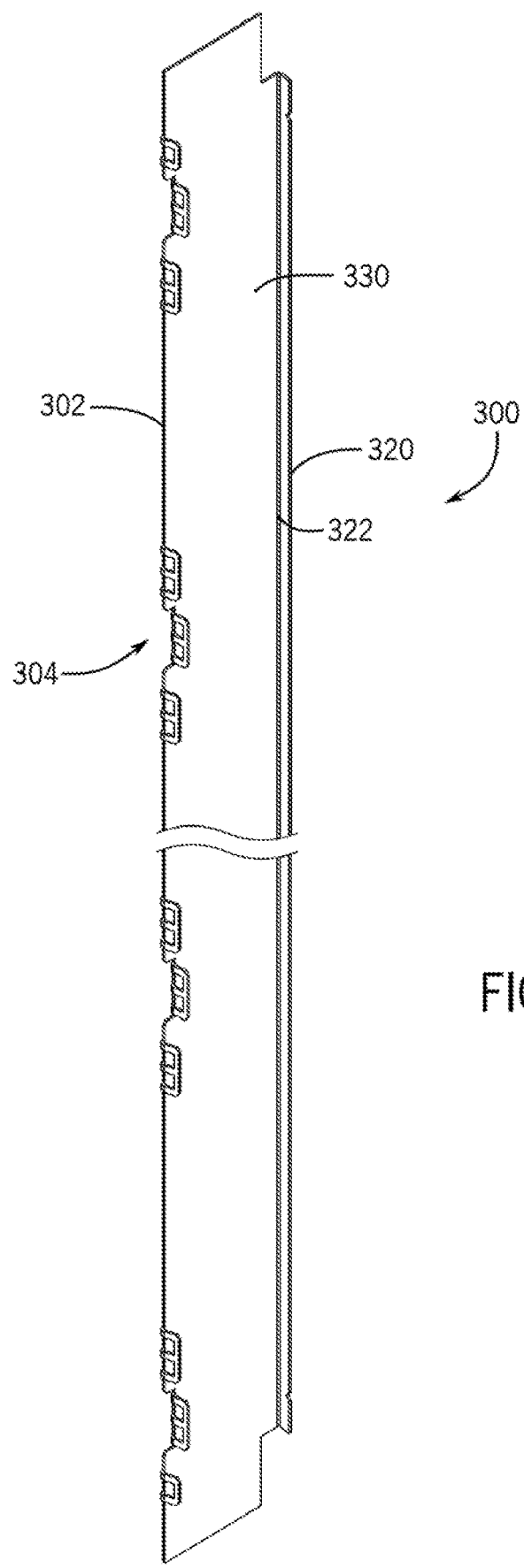
FIG. 12 is a top right rear isometric view of the cover of FIG. 11 shown in isolation.
Figure 13:
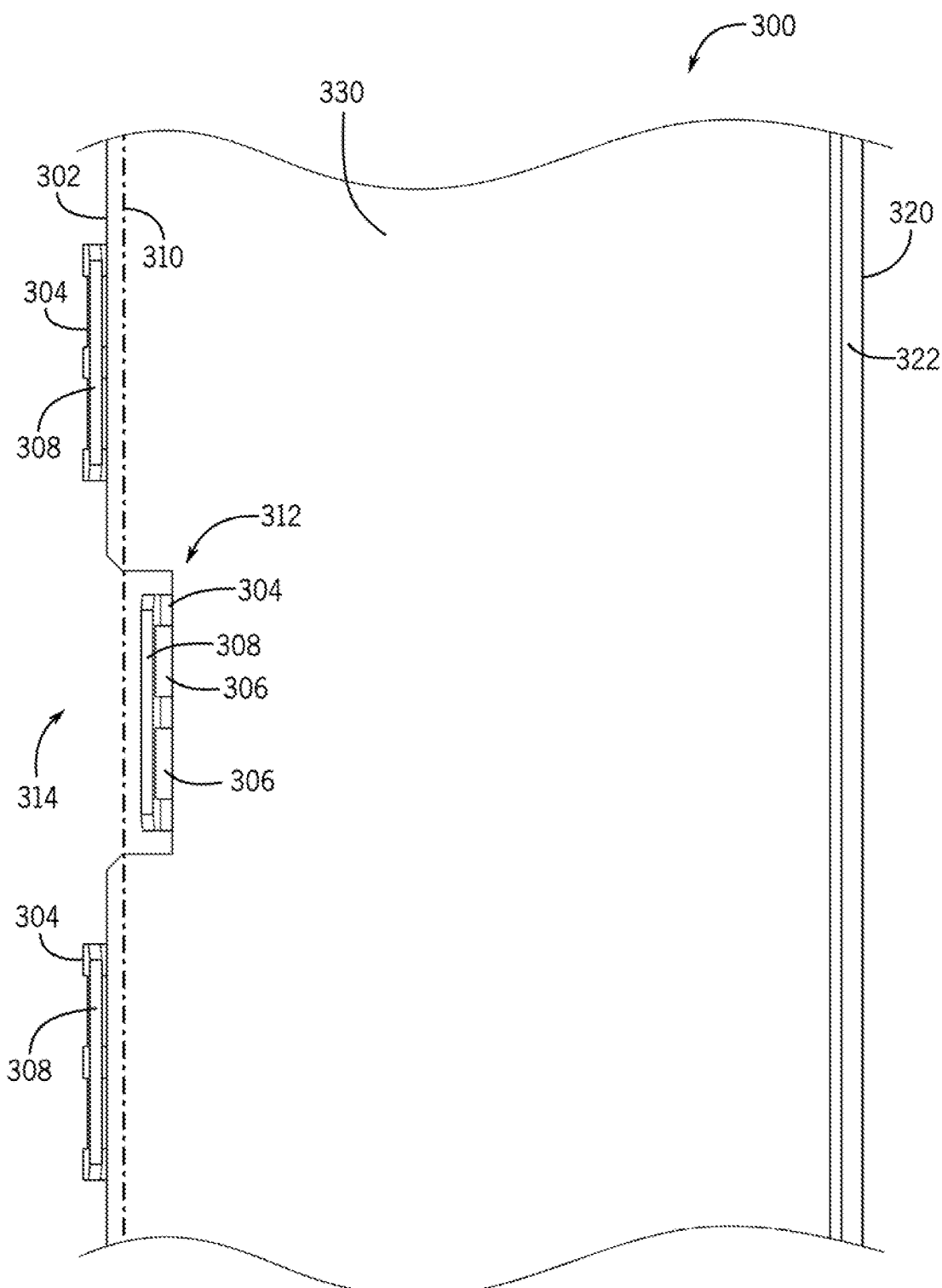
FIG. 13 is an enlarged rear view of a portion of the cover of FIG. 11.
Figure 14:
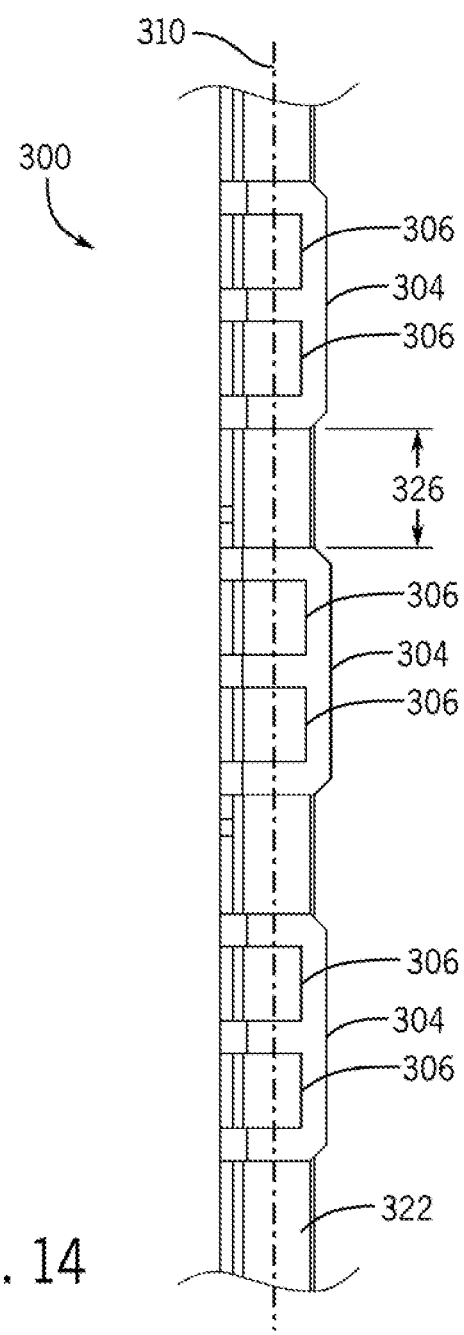
FIG. 14 is an enlarged side view of the portion of the cover of FIG. 13.
Figure 15:
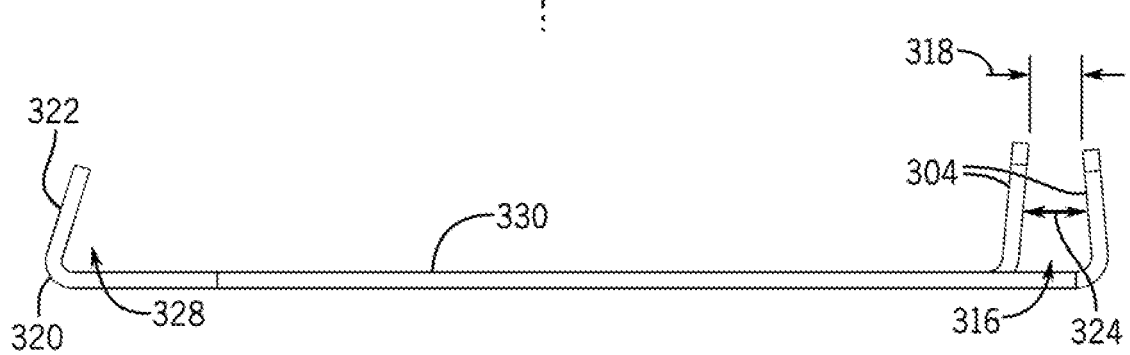
FIG. 15 is a top plan view of the over of FIG. 11.

In some embodiments, a cover can be configured to be hingedly and removably coupled to sets of cable support members that define a channel. For example, as shown in FIGS. 11 and 12 and as further discussed below, the cover 300 can be coupled to the hinge pin members 180B of the second set of cable support members 140B to cover the vertical cable channel 166. In particular, the cover 300 is rotatably engaged (i.e., "hinged") to allow access to the vertical cable channel 166 without requiring full removal of the cover 300.

Generally, covers according to some embodiments can include a plurality of hinge elements (e.g., tabs, with or without apertures) that are arranged with an alternating configuration on opposing sides of a common hinge axis. The hinge elements can thus be engaged with (e.g., snapped onto) hinge pin members that are aligned to extend along the common hinge axis and thereby secure the covers for hinged movement relative to the hinge pin members. Further, with appropriately resilient configuration of the hinge elements, the covers can be thereby secured without requiring the use of separate fasteners or even, in some cases, separate tools.

In this regard, for example, looking at FIGS. 12-15, the cover 300 has a plurality of hinge elements 304 (e.g., 304A, 304B, 304C) extending along a first side 302 of a main body 330 of the cover 300. The hinge elements 304 are alternatingly radially spaced from a hinge axis 310 (see FIG. 13) and also axially spaced along the hinge axis 310 forming a hinge channel 316 with a hinge channel width 324 (see FIG. 15) as may be measured in alignment with and perpendicular to the hinge axis 310. The hinge elements 304 are axially spaced apart an axial distance 326 (FIG. 14) and, in the illustrated example, no portion of adjacent sets of the hinge elements 304 overlap along the hinge axis 310 (although other configurations are possible).

In some embodiments, hinge elements can be contoured to help retain hinge pin members within a hinge channel, including through an angled or otherwise tapering configuration. For example, in the illustrated example, distal ends 308 of adjacent hinge elements 304 are spaced apart from each other by an end width 318 (FIG. 15) measured perpendicularly to (and offset radially from) the hinge axis 310. In particular, the end width 318 is smaller than the hinge channel width 324, with the hinge elements 304 exhibiting a linearly tapered profile as viewed along the direction of the hinge axis 310.

As a further example, each of the hinge elements 304 includes a set of recesses 306 (e.g., two recesses) that, as further discussed below, can help to secure the hinge elements 304 to hinge pin members. In particular, each recess 306 of the set of recesses 306 for a particular hinge element 304 is spaced axially apart from the adjacent recess 306 on the hinge element 304 along the hinge axis 310. In the illustrated example, the recesses 306 are generally rectangular and extend partly onto curved transitions from the hinge elements 304 onto the main body 330 of the cover 300. In other embodiments, however, other configurations are possible, including configurations with different numbers, shapes, sizes, or orientations of recesses, configurations with recesses that do not extend fully through the associated hinge member, and configurations without recesses.

As also noted above, some covers can be configured to securely engage a cable support member opposite from hinge elements, to help secure the covers in a closed orientation. For example, the cover 300 further includes a retaining element 322 extending along a second side 320 of the cover 300 opposite the first side 302, as shown in FIGS. 12-15. The retaining element 322 is configured to engage the first set of cable support members 140A of the cable management system 200, as described above, when the cover is in a closed state (shown in FIG. 17). Preferably, the retaining element 322 retains the first set of support cable members 140A by engaging the first set of cable support members 140A so as to induce a bias force therefrom against the retaining element 322 (or vice versa) to promote a more secure retention of the cover 300. For example, the retaining element 322 can angle inward and form a retaining element channel 328 (shown in FIG. 15). Due to the angled configuration of the retaining element 322, when the first set of cable members 140A are retained with the retaining element 322, the first set of cable members 140A are positioned within the retaining element channel 328. In other embodiments, however, other configurations are possible including configurations with retaining elements that do not define retaining channels similar to the retaining channel 328, retaining elements that do not extend continuously along an entire length of a cover, retaining elements that include recesses (e.g., through-openings) and so on.

Figure 16:
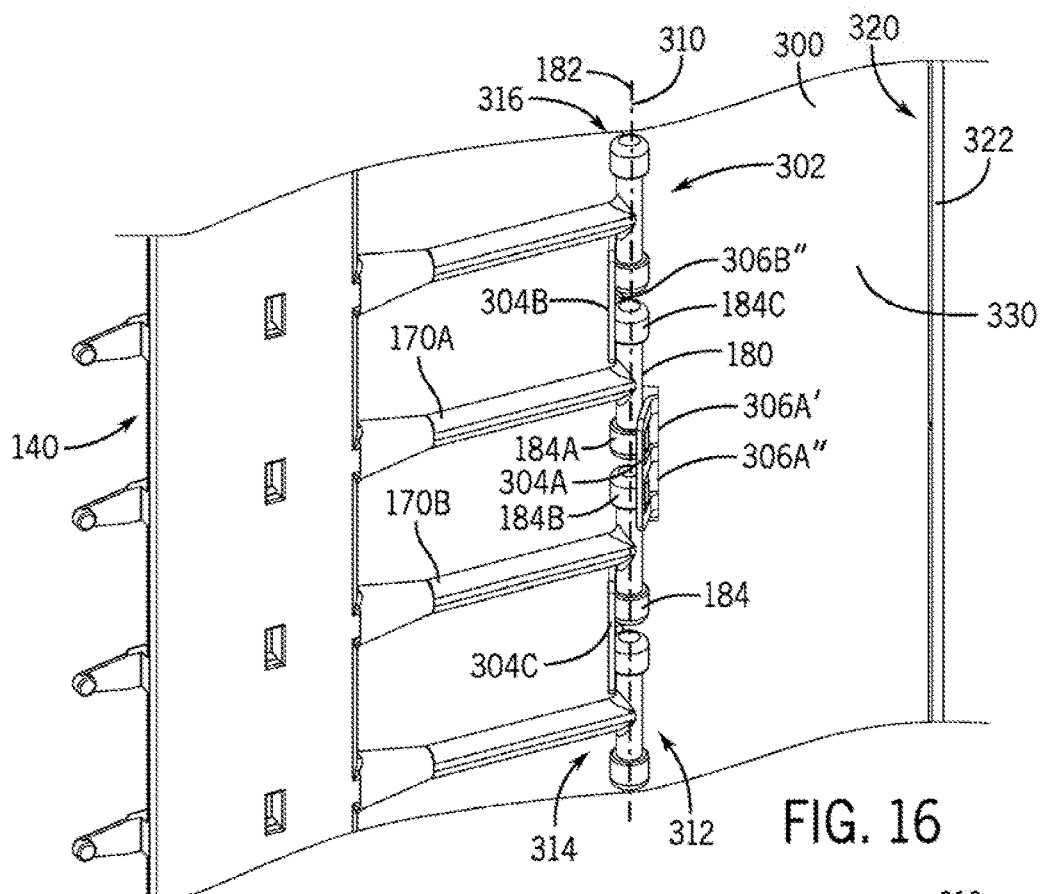
FIG. 16 is a left side view of the connection between a cable support member and a cover according to an embodiment of the invention.

In some embodiments, it may be useful to configure hinge elements to engage multiple hinge pin members in order to provide a more secure attachment. For example, each of the hinge elements 304 is configured to engage at least two adjacent instances of the hinge pin members 180, in order to hingedly secure the cover 300 to the cable management system 200. In some embodiments, hinge elements can be configured for interleaved engagement with hinge pin members. For example, as shown in FIG. 16, an example instance of the hinge elements 304 includes a first hinge element 304A on a first side 312 of a hinge axis 310 and second and third hinge elements 304B, 304C on a second side 314 of the hinge axis 310, with the three hinge elements 304A, 304B, 304C configured to collectively engage with two finger members 170A, 170B. In particular, in the example shown, the hinge element 304A, engages, respectively, the first and second adjacent finger members 170A, 170B, with a first hinge pin distal end 186A of the first adjacent finger member 170A received in the first recess 306A' of the hinge element 304A and a second hinge pin distal end 186B of the second adjacent finger member 170B received in the second recess 306A" of the hinge element 304A. Further, as shown, at least one hinge pin distal end 184A is received by a first recess 306A' of the first hinge element 304A on a first side 312 of the hinge axis 310 and at least another hinge pin distal end 184C is received by a second recess 306B" of the second hinge element 304B on a second side 314 of the hinge axis 310.

It is contemplated that engagement of the cover 300 to the cable support members 140 can be performed without the use of tools. For example, during installation, the relatively smaller dimension of the end width 318, with respect to the hinge channel width 324, produces a "snap-on" action wherein the hinge pin members 180 rotate relative to the base 142 as the bulbous portions 186 engage the distal ends 308 of adjacent hinge elements 304. With continued movement of the cover 300 toward the base 142 of the cable support member 140, the bulbous portions 186 are then received within the set of recesses 306 as the hinge pin members 180 rotate or snap back into their original orientation. The hinge pin member axis 182 is then substantially coincident with the hinge axis 310. The relatively smaller dimension of the end width also aids in retaining the hinge pin members 180 within the hinge channel 316.

Figure 17:
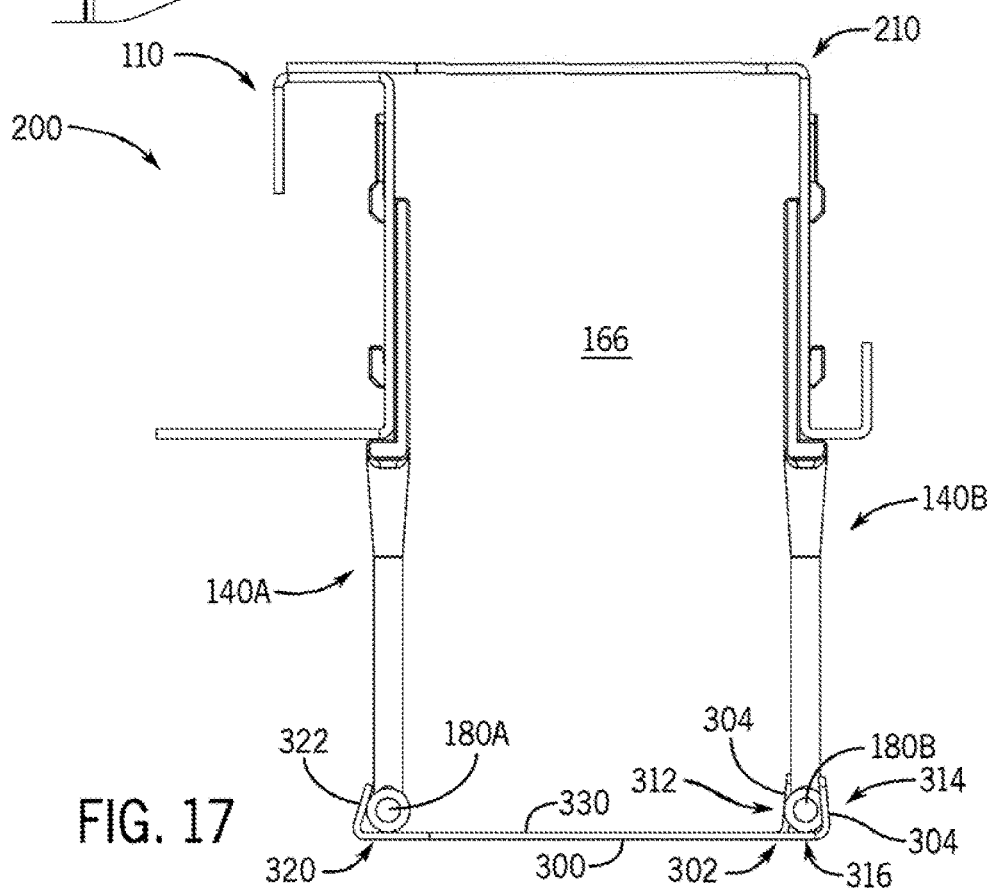
FIG. 17 is a top plan view of the vertical cable channel, cable support members, and cover of FIG. 11.
Figure 18:
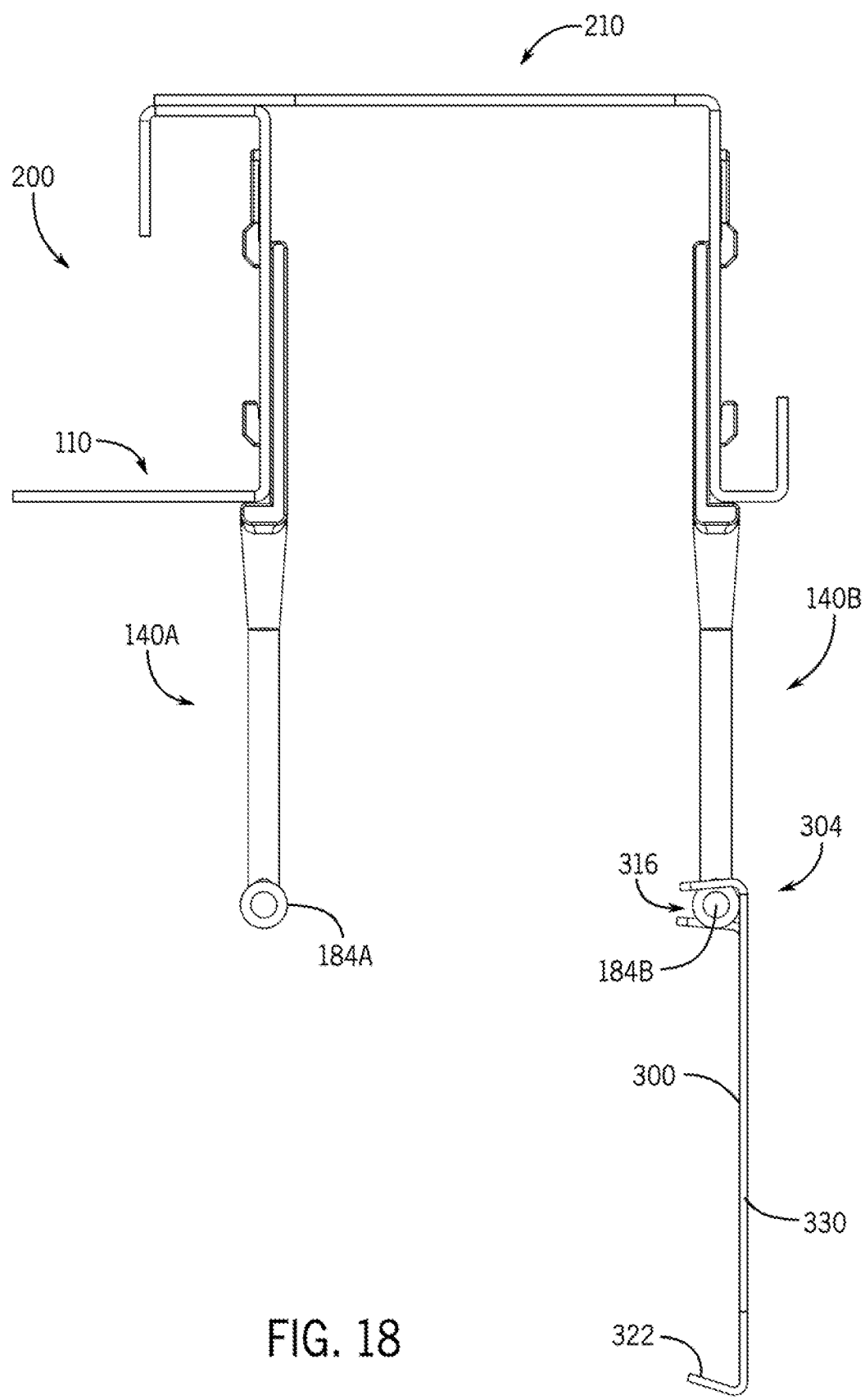
FIG. 18 is a top plan view of the vertical cable channel and cable support members of FIG. 11 with the cover in an open position.

FIG. 17 illustrates a closed state of the cover 300 with the first set of cable support members 140A retained within the retaining element 322 and FIG. 18 illustrates an open state of the cover 300 with the cover 300 rotated away from the first set of cable support members 140A. Although shown in FIG. 18 as rotated approximately 90 degrees from the closed state shown in FIG. 17, the cover 300 can be configured to be opened up to approximately 120 degrees (i.e., to within ±5 degrees) or more from the closed state. This relatively large opening angle, as facilitated by the cooperative arrangement of the hinge elements 304 and the hinge pin members 180 can facilitated easy access to the channel 166 for installation and adjustment of relevant cables. In this regard, in some embodiments, the axial distance 326 between adjacent hinge elements 304 (see FIG. 14) may be greater than the shaft thickness 188 of the shaft distal end 176 (see, e.g., FIG. 6). Thus, with the arrangement in which the hinge pin members 180B are retained by the hinge elements 304 within the hinge channel 316, the cover 300 can rotate relative to the cable support member 140B without interference between any of the hinge elements 304 and the shaft distal end 176B.

In some embodiments, a cover can be reversibly installed, including to provide easy customization of the direction with which a particular cover opens and, in some cases, even to provide different covers along a single cable channel that can open in different directions. In this regard, for example, the cover 300 may also be selectively installed with the plurality of hinge elements 304 engaged with the first set of cable support members 140A and, when in a closed state, the retaining element 322 engaged with the second set of cable support members 140B (i.e., with the cover 300 reversed from the orientation shown in FIG. 17). In some examples, reversibility of a cover according to this disclosure can be particularly beneficial because users may be able to easily install cable management channels with covers, without worrying about whether appropriate hardware or other specialized components have been provided on the correct side (e.g., top, bottom, left, or right side) of the cable channel.

The method of installing a cable support member 140 on a rack angle member 110 of a server cabinet 10 as shown in FIGS. 7A-7D can be expanded to the installation of cable support members for the cable management system 200, with reference to FIGS. 8-11. In some cases, the method can further include coupling the channel bracket 210 to the rack angle member 110 and engaging the second set of the cable support members 140B with the channel bracket 210 to define the vertical cable channel 166 between the first cable support member 140A and the second cable support member 140B. Additionally, with reference again to FIGS. 12 and 13, the method can further include manipulating the cover 300 so that the plurality of hinge elements 304 receive the hinge pin members 180 on the first or second cable support members 140A, 140B and selectively rotating the cover 300 so that the retaining element 322 releasably receive the hinge members 180 on the other of the first or second cable support members 140A, 140B.

Figure 19:
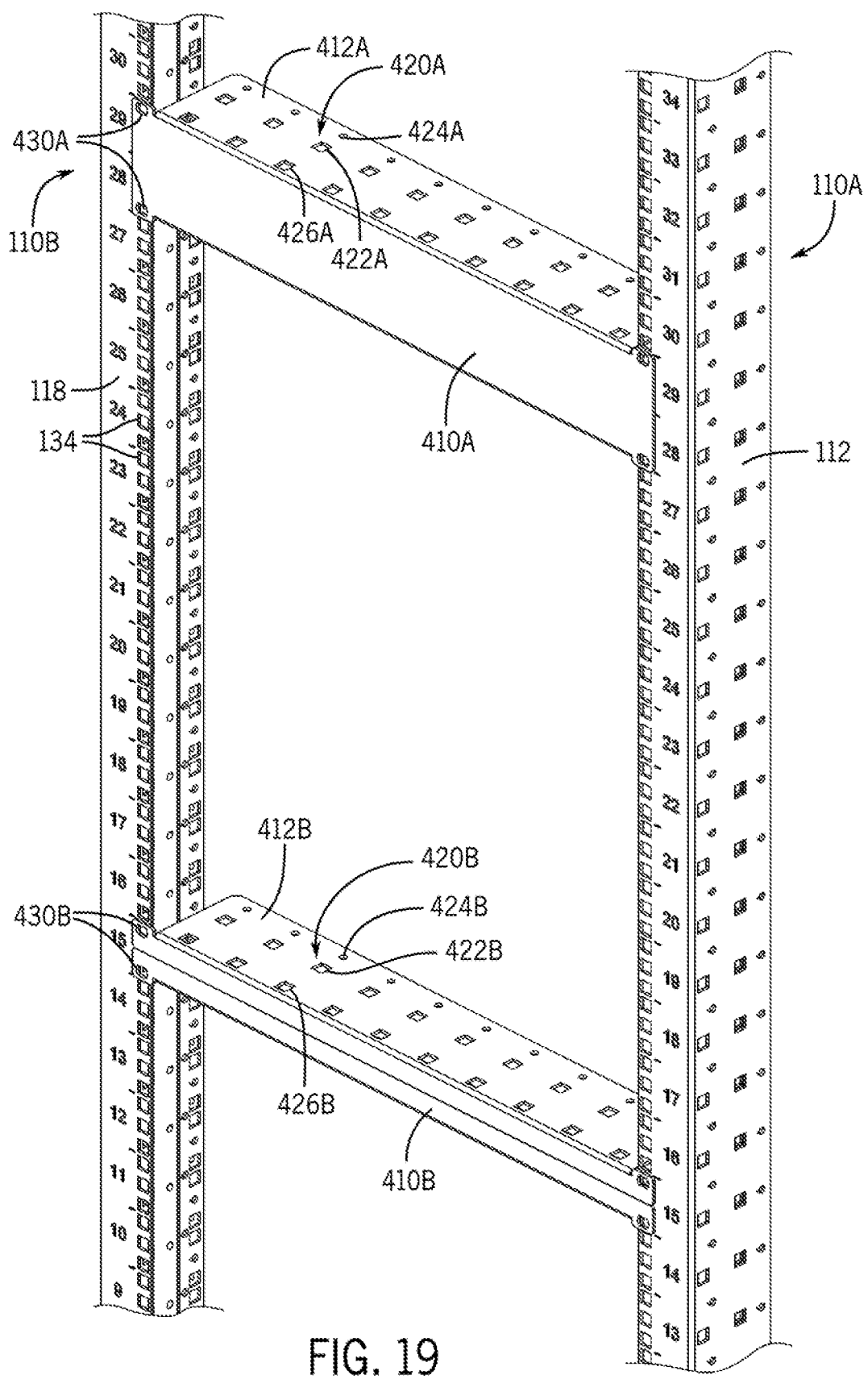
FIG. 19 is a top right front isometric view of a set of horizontal support members according to an embodiment of the invention.

Although some discussion above relates specifically to vertical cable management (e.g., with vertical cable channels), other examples can relate to other orientations. For example, FIG. 19 shows a set of example horizontal support members 410A, 410B that form part of a set of horizontal cable management systems 400A, 400B shown in FIGS. 20 and 21. The horizontal support members 410A, 410B are configured to extend between and be coupled to third planar portions 118 of a first rack angle member 110A and a second rack angle member 110B. As illustrated for the first rack angle member 110A, the third planar portion 118 extends perpendicularly from the first planar portion 112, opposite the second planar portion 116, and has holes 134 to receive fasteners for coupling to other support members. First planar portions 412A, 412B of the horizontal support members 410A, 410B have apertures 420A, 420B, which include respective first apertures 422A, 422B, second apertures 424A, 424B, and third apertures 426A, 426B, and which are configured to receive the first engagement member 154, the protrusion 158 at the distal end 156 of the first engagement member 154, and the second engagement member 160 of the cable support member 140 (shown in FIGS. 3-6), respectively, as similarly described above relative to the rack angle member 110.

In different embodiments, horizontal support members can comprise one or more pieces. For example, the first horizontal support member 410A comprises one piece and the second horizontal cable support member 410B comprises two pieces. Further, single-piece (or other) horizontal support members can have different heights to provide wider or narrower cable channels, once appropriate cable support members have been attached thereto. And the multi-piece support members (e.g., the support member 410B) can be separated and spaced apart as desired to provide cable channels of customizable widths.

Figure 20:
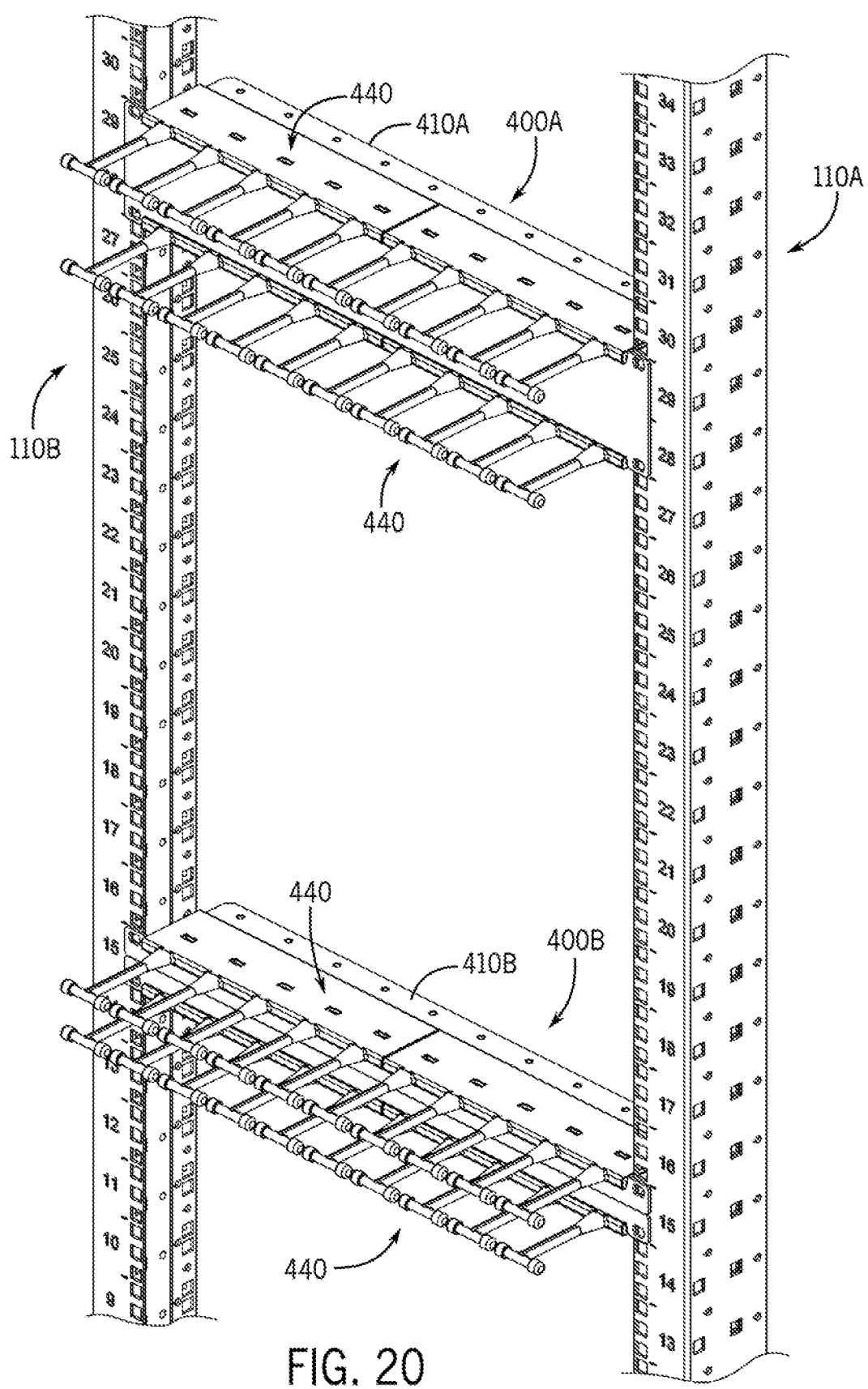
FIG. 20 is a top right front isometric view of the set of horizontal support members of FIG. 19 with attached cable support members to form a horizontal cable channel according to an embodiment of the invention.
Figure 21:
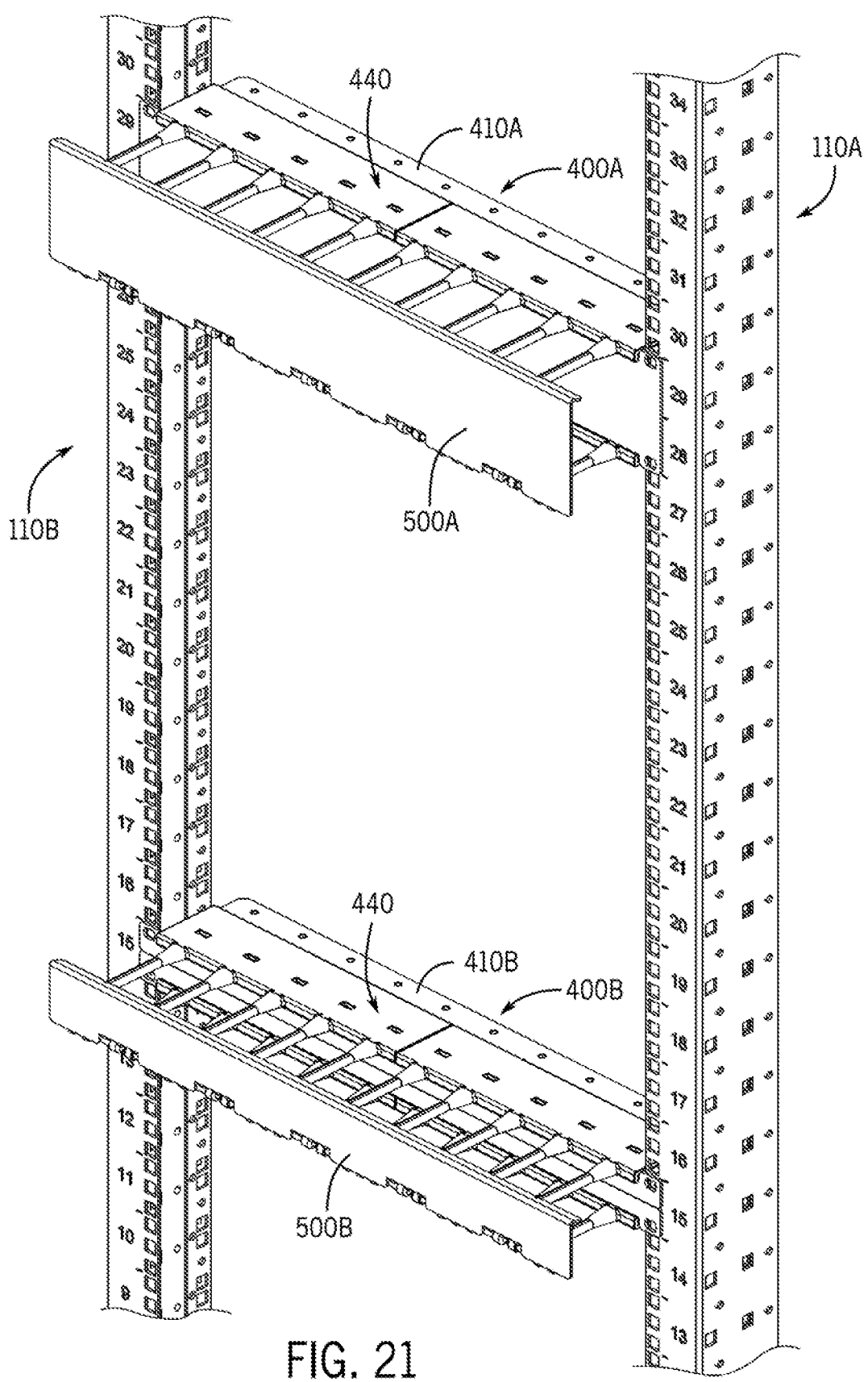
FIG. 21 is a top right front isometric view of the set of horizontal cable channels of FIG. 20 with attached covers according to an embodiment of the invention.

In addition to the horizontal support member 410, the horizontal cable management system 400 can include the cable support members 440 and covers 500A, 500B as shown in FIGS. 20 and 21. The plurality of cable support members 440 are substantially similar to the cable support members 140 described above, and can be similarly installed within the cable management system 400. Likewise, the covers 500A, 500B can be installed similarly to the cover 300, with the different sizes of the covers 500A, 500B accommodating the different sizes of the cable channels defined by the cable management system 400A, 400B. It should be understood that a cover according to the present invention can be sized and configured to hingedly couple to other dimensioned horizontal support members as well.

Figure 22:
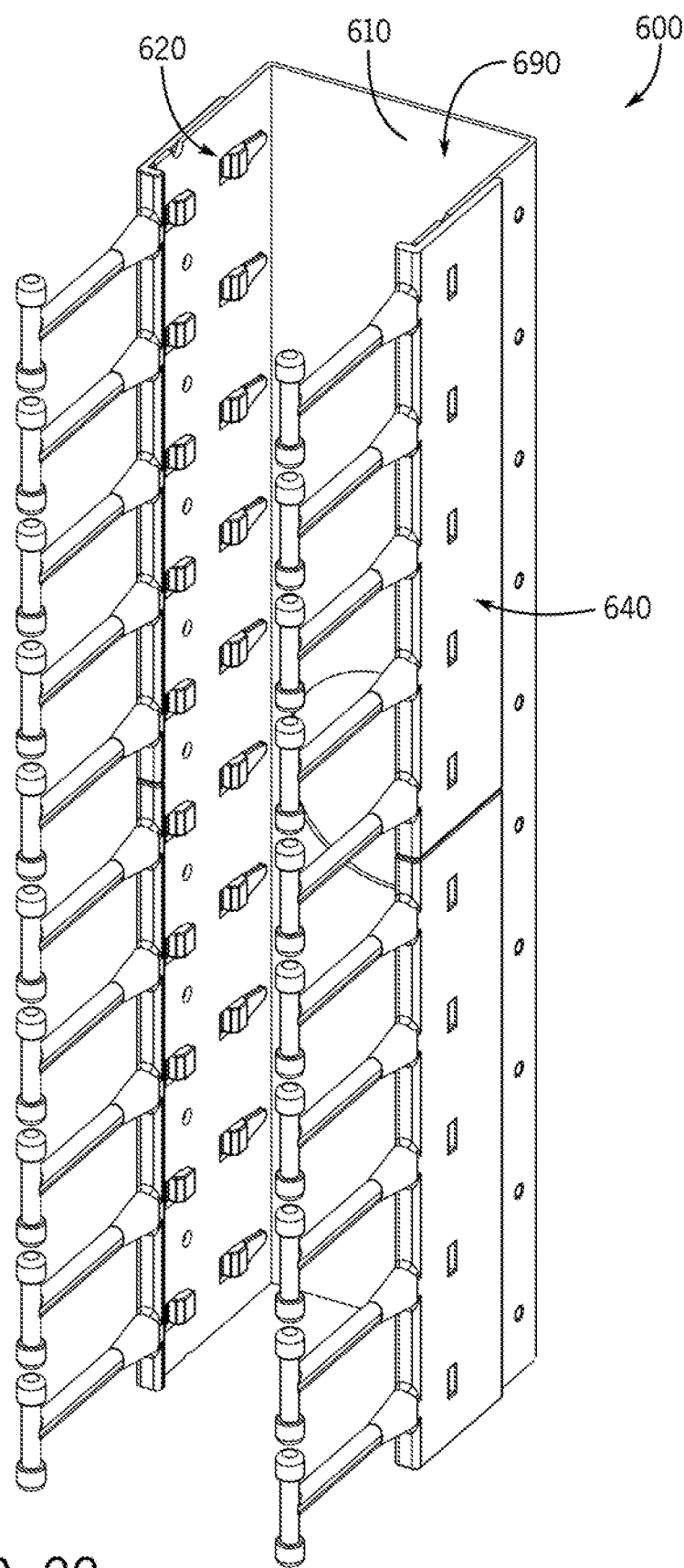
FIG. 22 is a top right front isometric view of a cable channel according to another embodiment of the invention.

FIG. 22 illustrates another example cable management system 600 according to the present invention. In many aspects, the cable management system 600 is similar to the cable management system 200 described above, and similar numbering, in the 600 series, is used for the cable management system 600. For example, the cable management system 600 has a plurality of cable support members 640 that are generally similar to the cable support members 140 (see, e.g., FIGS. 5 and 6). In some aspects, however, the cable management systems 200, 600 differ from each other. For example, a vertical cable channel 690 is partially defined by a one-piece channel member 610 (e.g., in contrast to the combination of the channel member 210 and the rack angle member 110 shown in FIG. 10). Sets of apertures 620 are provided on opposing walls of the one-piece channel member 610. The plurality of cable support members 640 can be removably secured to the one-piece channel member 610 by engaging the sets of apertures 620 as similarly described above for the cable support members 140.

In other embodiments, other configurations are possible. For example, certain features and combinations of features that are presented with respect to particular embodiments in discussion above, can be utilized in other embodiments and in other combinations, as appropriate. In this regard, for example, different configurations of rack angle members, channel brackets, cable support members, and covers, and so on, as presented with respect to a particular one of the cable management systems 200, 400 can be implemented in combination with features of any number of the other cable management systems 400, 200, or others.

Thus, embodiments of the inventions provide improved cable management in a server cabinet. In some embodiments, cable management systems according to the invention can substantially improve the ease of routing and organizing cables within the server cabinet, such as by incorporating cable support members that can be securely and removably coupled to a rack angle member. Further, parallel sets of cable support members can be provided to define a cable channel, both vertically and horizontally, within the server cabinet. Additionally, some embodiments of the invention can include cable support members that include hinge elements that interact with hinge elements on a cover to provide a more protected, but still easily accessible, cable channel.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A cover for a cable management system that includes cable support members with finger members, the cover comprising:
    a cover body configured to at least partially enclose cables within the cable management system; and
    a plurality of hinge elements extending along a first side of the cover body and alternatingly radially spaced in opposing directions from a hinge axis to form a hinge channel, each of the plurality of hinge elements including a set of recesses, with each recess of the set of recesses being configured to receive a hinge pin member of a cable support member of the cable management system, and each set of recesses including a first recess and a second recess spaced axially from the first recess along the hinge axis;
    wherein each of the plurality of hinge elements is configured to engage with the cable support member of the cable management system, to support the cover for hinging movement relative to the cable support member, when the cable support member is disposed along the hinge axis, with the first recess of a first of the hinge elements configured to receive a first end of a first finger member of the cable support member and the second recess of a second of the hinge elements that is adjacent to the first of the hinge elements configured to receive a second end of the first finger member.

2. The cover of claim 1, wherein the hinge elements are integrally formed on the cover body.

3. The cover of claim 1, wherein each of the hinge elements is axially spaced apart from one or more adjacent hinge elements along the hinge axis.

4. The cover of claim 1, further comprising a retaining element extending along a second side of the cover body opposite the first side, the retaining element being integrally formed on the cover body.

5. The cover of claim 4, wherein the cover is configured to be installed relative to first and second cable support members of the cable management system that are spaced apart from each other transverse to the hinge axis to define a cable channel;
    wherein, in a first orientation, the plurality of hinge elements is configured to engage the first cable support member to support the cover for hinging movement relative to the first cable support member and the retaining element is configured to engage the second cable support member to selectively secure the cover in a first closed orientation over the cable channel; and
    wherein, in a second orientation, the plurality of hinge elements is configured to engage the second cable support member to support the cover for hinging movement relative to the second cable support member and the retaining element is configured to engage the first cable support member to selectively secure the cover in a second closed orientation over the cable channel.

6. A cable management system comprising:
    a cover including a plurality of hinge elements that extend along a first side of the cover and are alternatingly radially spaced from a hinge axis to form a hinge channel with a hinge channel width, each of the hinge elements having a set of first and second recesses;

a first cable support member having a plurality of finger members, each of the plurality of finger members having a first hinge pin member that includes:
   a first set of first and second hinge pin distal ends aligned along a first hinge pin member axis; and
   a hinge pin bar extending between the first set of first and second hinge pin distal ends, the hinge pin bar having a hinge pin bar thickness measured perpendicularly to the first hinge pin member axis;
each of the first and second hinge pin distal ends being thicker, perpendicularly to the hinge axis, than the hinge channel width and the hinge pin bar thickness; and
the first sets of first and second hinge pin distal ends being received within the sets of first and second recesses, with the first hinge pin member axis aligned with the hinge axis, to hingedly secure the cover to the first cable support member.

7. The cable management system of claim 6, wherein each of the plurality of hinge elements engages, respectively, first and second adjacent finger members of the plurality of finger members, with a first hinge pin distal end of the first adjacent finger member received in the first recess of the hinge element and a second hinge pin distal end of the second adjacent finger member received in the second recess of the hinge element.

8. The cable management system of claim 7, wherein, for each of the plurality of finger members, at least one hinge pin distal end is received by a first recess of a first one of the plurality of hinge elements on a first side of the hinge axis and at least another hinge pin distal end is received by a second recess of a second one of the plurality of hinge elements on a second side of the hinge axis.

9. The cable management system of claim 8, wherein the hinge elements are axially spaced along the hinge axis with no portion of adjacent hinge elements overlapping along the hinge axis.

10. The cable management system of claim 9, wherein each of the plurality of finger members has a shaft connecting the first hinge pin member with a base of the first cable support member, the shaft having a shaft thickness at a shaft distal end; and
   wherein the hinge elements are axially spaced apart by a distance greater than the shaft thickness.

11. The cable management system of claim 6, wherein the hinge pin bar thickness is approximately equal in dimension to the hinge channel width.

12. The cable management system of claim 6, wherein distal ends of adjacent sets of the plurality of hinge elements are spaced apart from each other by an end width that is smaller than the hinge channel width, as measured perpendicularly to the hinge axis.

13. The cable management system of claim 6, wherein the first cable support member has a set of engagement members configured to attach the first cable support member to a rack angle member of a cabinet; and
   wherein the set of engagement members includes a first engagement member configured to be received through a first aperture in the rack angle member to engage with a second aperture in the rack angle member.

14. The cable management system of claim 6, further comprising a second cable support member having a plurality of second finger members, each of the second finger members having a second hinge pin member with a second set of first and second hinge pin distal ends aligned along a second hinge pin member axis;
   the first and second cable support members defining a cable channel;
   the cover including a retaining element extending along a second side opposite the plurality of hinge elements; and
   the second set of first and second hinge pin distal ends being configured to be retained by the retaining element to secure the cover to extend at least partially over the cable channel.

15. The cable management system of claim 14, wherein the cover is configured to be selectively reversed so that the plurality of hinge elements of the cover engage with the second set of first and second hinge pin distal ends and the retaining element of the cover is configured to retain the first set of first and second hinge pin distal ends to secure the cover to extend at least partially over the cable channel.

16. A method for covering a cable channel of an equipment cabinet, the cable channel defined around a hinge axis by first and second cable support members, the method comprising:
   selectively aligning a plurality of hinge elements that extend along a first side of a cover with a selected one of either a first set of hinge pin members of the first cable support member or a second set of hinge pin members of the second cable support member, each hinge pin member of the first set of hinge pin members including first and second hinge pin distal ends aligned along a first hinge pin member axis, and each hinge pin member of the second set of hinge pin members including first and second hinge pin distal ends aligned along a second hinge pin member axis;
   engaging the plurality of hinge elements with the selected first or second set of hinge pin members, with the first and second hinge pin distal ends of the hinge pin members of the selected first or second set of hinge pin members received within corresponding recesses of the plurality of hinge elements, and with the first or second hinge pin member axis of the selected first or second set of hinge pin members aligned with the hinge axis;
   rotating the cover relative to the hinge pin members to a closed orientation; and
   with the cover in the closed orientation, retaining the first and second hinge pin distal ends of the other of the selected one of the first or second set of hinge pin members with a retaining element that extends along a second side of the cover opposite the first side, to secure the cover to extend at least partially over the cable channel.

* * * * *